United States Patent
Vinci et al.

(10) Patent No.: US 12,393,217 B2
(45) Date of Patent: Aug. 19, 2025

(54) LOAD CURRENT SIMULATOR

(71) Applicants: Ian R. Vinci, Woodstock, NY (US); Peter Vinci, Woodstock, NY (US)

(72) Inventors: Ian R. Vinci, Shandaken, NY (US); Peter Vinci, Shandaken, NY (US); Richard A. Frantz, Hatboro, PA (US)

( * ) Notice: Subject to any disclaimer, the term of this patent is extended or adjusted under 35 U.S.C. 154(b) by 1065 days.

(21) Appl. No.: 16/575,488

(22) Filed: Sep. 19, 2019

(65) Prior Publication Data
US 2020/0150708 A1    May 14, 2020

Related U.S. Application Data

(60) Provisional application No. 62/757,773, filed on Nov. 9, 2018.

(51) Int. Cl.
G05F 3/02    (2006.01)
G01R 31/00   (2006.01)
B60R 16/02   (2006.01)

(52) U.S. Cl.
CPC ............. *G05F 3/02* (2013.01); *G01R 31/007* (2013.01); *B60R 16/02* (2013.01)

(58) Field of Classification Search
CPC .......... G05F 3/02; G01R 31/007; B60R 16/02
See application file for complete search history.

(56) References Cited

U.S. PATENT DOCUMENTS

| | | | | |
|---|---|---|---|---|
| 4,613,821 A | * | 9/1986 | Sternberg | G01V 3/06 324/323 |
| 7,124,003 B1 | * | 10/2006 | West | G01R 31/007 324/504 |
| 8,861,947 B2 | * | 10/2014 | Webb | H04N 23/685 396/421 |
| 8,947,096 B1 | * | 2/2015 | Wolf | B60Q 11/00 324/504 |
| 9,162,612 B2 | * | 10/2015 | Hanson | B60T 17/221 |
| 9,727,073 B1 | * | 8/2017 | Voo | G05F 3/02 |
| 10,196,052 B2 | | 2/2019 | Vinci et al. | |
| 2005/0035752 A1 | * | 2/2005 | Bertness | G01R 31/007 324/120 |

(Continued)

OTHER PUBLICATIONS

DigiKey article Snippet dated May 19, 2016 after google search for low side driver. (Year: 2016).*

*Primary Examiner* — Jared Fureman
*Assistant Examiner* — Michael J Warmflash
(74) *Attorney, Agent, or Firm* — LAW OFFICES OF MICHAEL L. WISE, LLC

(57) ABSTRACT

An electronic device for simulating load currents when testing a tow-vehicle brake controller is described. The electronic device utilizes current monitoring circuitry to measure a current of an input signal from the tow vehicle. The electronic device also includes a series of resistors that are arranged in parallel on the input signal as wells a series of switches (e.g., relays or transistors) that can activate and deactivate each one of the resistors. Microcontroller circuitry within the electronic device controls the series of switches based on the measured current of the input signal, and, by extension, controls the series of resistors applied to the input signal. In so doing, the electronic device is able to simulate a desired load current on the tow-vehicle brake controller being tested.

4 Claims, 3 Drawing Sheets

(56) References Cited

U.S. PATENT DOCUMENTS

| | | | |
|---|---|---|---|
| 2015/0219706 A1* | 8/2015 | Loftus | B60L 58/20 |
| | | | 324/503 |
| 2015/0286235 A1* | 10/2015 | Vahid Far | G05F 1/575 |
| | | | 323/315 |
| 2017/0018586 A1* | 1/2017 | Hatanaka | G05F 3/02 |
| 2017/0305402 A1* | 10/2017 | Vinci | B60T 17/221 |
| 2020/0018786 A1* | 1/2020 | Lin | G01R 31/1272 |

* cited by examiner

LOAD CURRENT SIMULATOR

FIELD OF THE INVENTION

The present invention relates generally to electronic devices for use with vehicles, and, more particularly, to electronic devices for simulating a load current to test vehicle brake controllers.

BACKGROUND OF THE INVENTION

Many newer vehicles that are likely to be used to tow trailers (i.e., tow vehicles) come with integrated brake controllers designed to control the electric brakes on a trailer. Typically, the electric brake signal emanating from these controllers is a 12-volt (V) pulse whose width changes with the amount of braking force desired. An advantage of the pulsed signal is that the electronic brake controller circuitry is simplified and inherently more reliable.

As brake controllers have become more sophisticated, they have added monitoring circuits to identify a properly connected trailer. Newer brake controllers are not only looking for a load but also the "signature" of a trailer's electric brakes. Electric trailer brakes use an electromagnet to supply the braking energy to the trailer. Electrically these brake magnets look like an inductor, and therefore display a rising current over time when subjected to a direct current (DC) voltage. Each electric trailer brake also provides a resistance, which can be detected by the tow vehicle via a characteristic load current.

Both the pulsed brake signal and the load detection circuitry in modern brake controllers make these devices more effective at accomplishing their tasks, but at the same time, more difficult for a technician to test for proper operation.

SUMMARY OF THE INVENTION

Embodiments of the present invention address the above-identified needs by providing electronic devices for simulating load currents when testing tow-vehicle brake controllers.

Aspects of the invention are directed to an apparatus comprising current monitoring circuitry, a plurality of resistors, a plurality of switches, and microcontroller circuitry. The current monitoring circuitry is operative to measure a current of an input signal. The plurality of resistors are arranged in parallel on the input signal. Each of the plurality of switches is operative to activate and deactivate a respective one of the plurality of resistors. Lastly, the microcontroller circuitry is operative to control the plurality of switches at least in part based on data from the current monitoring circuitry.

Additional aspects of the invention are directed to a method of simulating a load current. A current of an input signal is measured. A plurality of switches are then controlled via microcontroller circuitry at least in part based on the measured current. Each of the plurality of switches is operative to activate and deactivate a respective resistor of a plurality of resistors arranged in parallel on the input signal.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

As used herein, a "brake control signal" may comprise many different forms. It may, for example, be in the form of a variable DC signal with the amplitude of the signal driving the intensity of braking at the trailer, or may instead be in the form of a train of pulses like those found when transmitting a signal via pulse width modulation (PWM).

Figure 1:
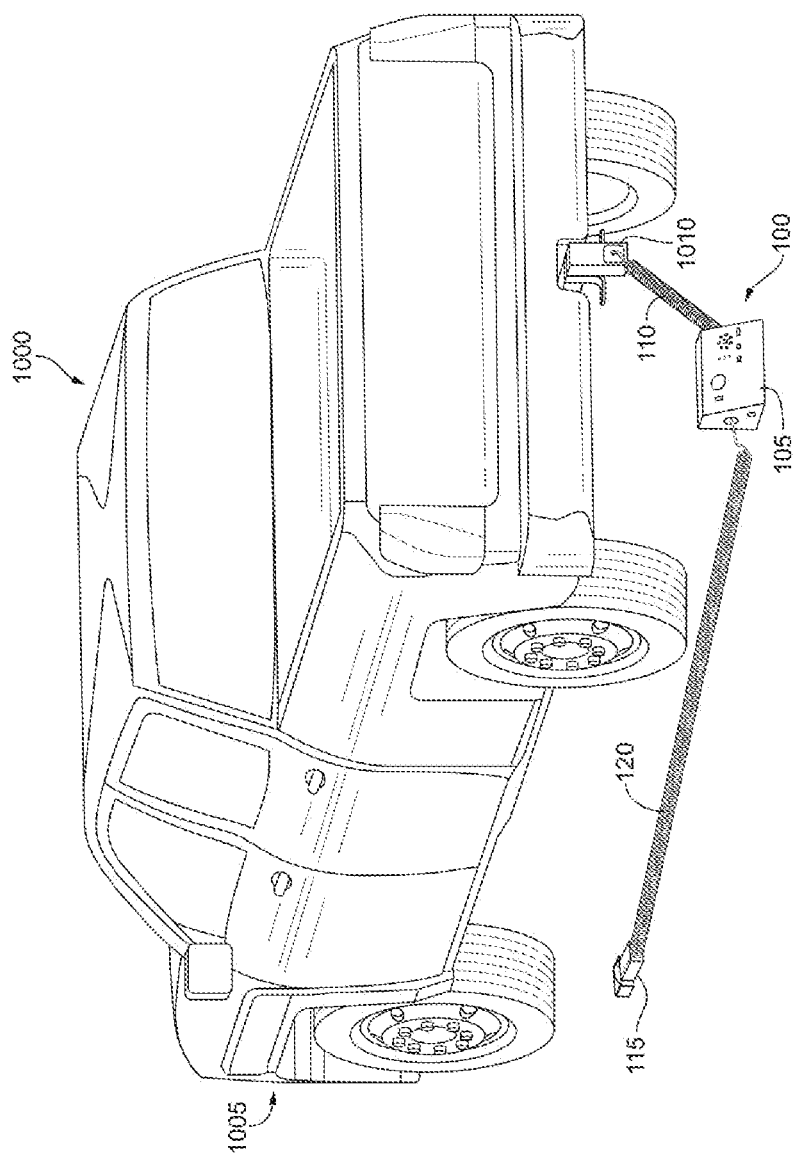
FIG. 1 shows a perspective view of a load simulator in accordance with an illustrative embodiment of the invention, in combination with a tow vehicle.

FIG. 1 shows a perspective view of a load simulator 100 in combination with a tow vehicle 1000, in accordance with an illustrative embodiment of the invention. The tow vehicle 1000 includes a tow-vehicle brake controller 1005, which is in signal communication with a tow-vehicle electrical connector 1010 disposed at the rear of the tow vehicle 1000. The load simulator 100 is housed in a load simulator box 105 and is connected to the tow-vehicle electrical connector 1010 of the tow vehicle 1000 via a first cable 110. The load simulator 100 is thereby placed in signal communication with the tow-vehicle brake controller 1005 of the tow vehicle 1000. A remote control head 115 is also shown in the figure, with the remote control head 115 attached to the load simulator 100 via a second cable 120.

Figure 2:
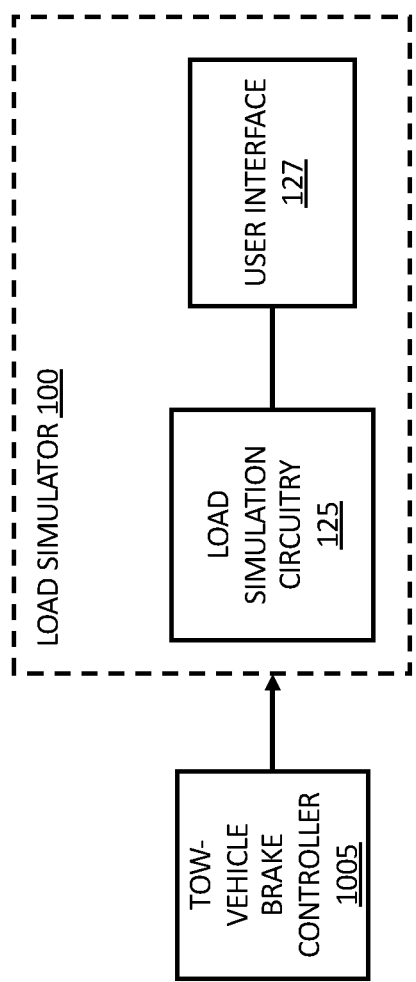
FIG. 2 shows a block diagram of the FIG. 1 load simulator and tow-vehicle brake controller.

Additional aspects of the load simulator 100 are shown in the block diagram in FIG. 2. The load simulator includes load simulation circuitry 125 in signal communication with a user interface 127. Both the load simulation circuitry 125 and the user interface 127 are in signal communication with the tow-vehicle brake controller 1005. In the present illustrative embodiment, the user interface 127 is placed on a face of the load simulator box 105 as well as on the remote control head 115. In other embodiments, the user interface 127 may be provided via a software application that runs on a mobile computing device such as a laptop computer, a smart phone, or a tablet computer. Communication between the laptop computer, smart phone, or tablet computer and the load simulation circuitry 125 may by be any number of wireless communication protocols including, for example, Wi-Fi and Bluetooth.

In operation, the illustrative load simulator 100 is operative to create a load current that simulates the presence of one or more sets of electric trailer brakes. A trailer with a single axle (i.e., two electric brakes) might display a load current of 7 amps (A) when driven by a 12-V brake control signal (meaning that the two electric brakes have an equivalent load resistance of about 1.7 ohms ($\Omega$)). Given that brakes are arranged in parallel, each additional axle might add an additional 1.7$\Omega$ of load resistance, or 7 A to the load current. A two-axle trailer might therefore have a load current of 14 A, a three-axle trailer might have a load current of 21 A, and so forth.

Figure 3:
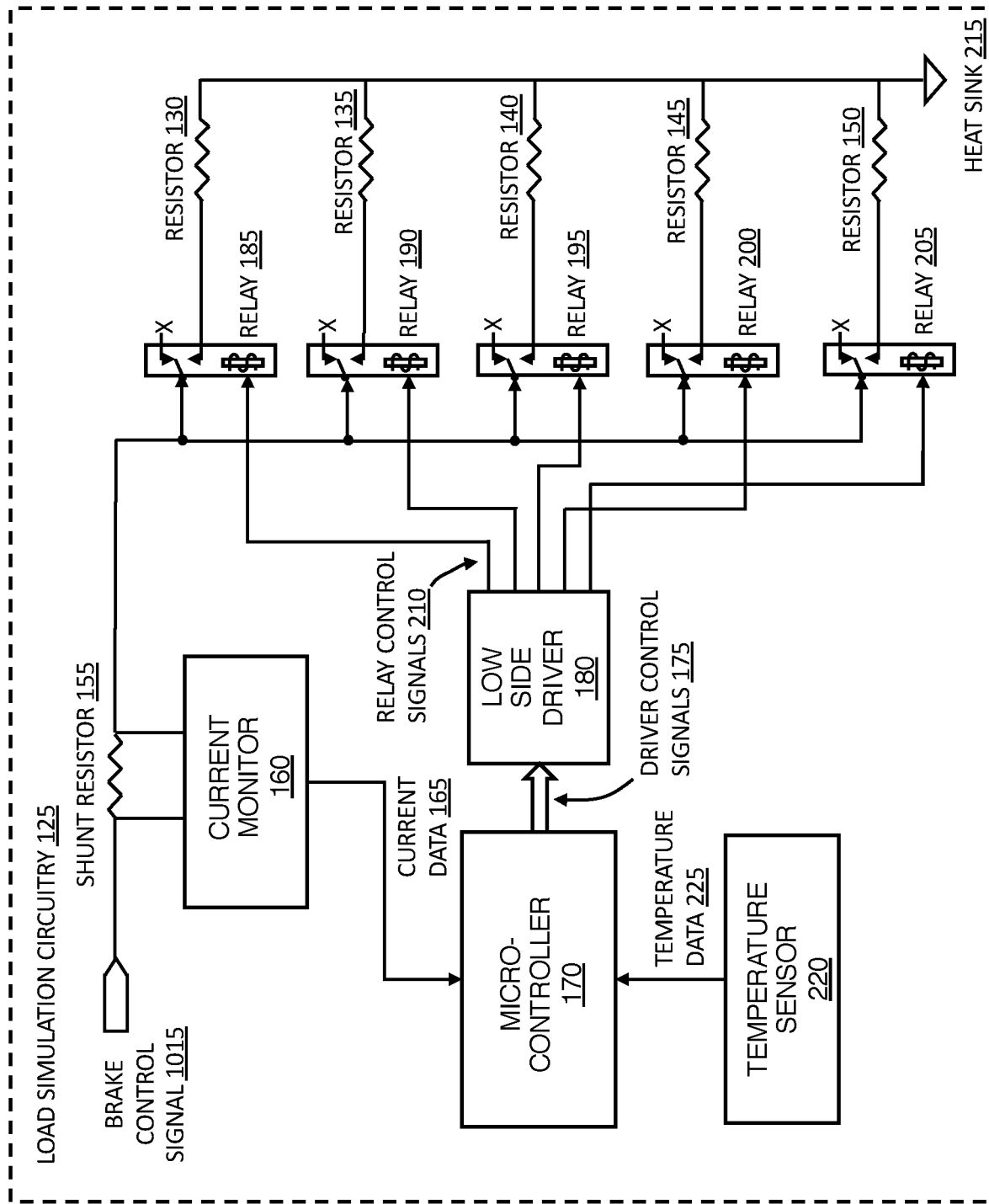
FIG. 3 shows a combination block diagram and electrical schematic showing aspects of the load simulation circuitry in the FIG. 1 load simulator.

FIG. 3 shows a combination block diagram and electrical schematic that describes aspects of the illustrative load simulation circuitry 125. In presenting the load simulation circuitry 125 in FIG. 3, it will be apparent that many commonly-utilized circuit elements are not explicitly shown in the figure. This is solely for economy of description. For example, power supplies, decoupling capacitors, voltage dividers, ground connections, etc. are not expressly represented in the diagram. Nevertheless, one having ordinary skill in the art will immediately recognize these missing elements and would be able to readily implement aspects of the invention based on the teachings provided herein. Additional information about circuit design is also available in many readily available references, such as, for example, P. Horowitz et al., The Art of Electronics, Second Edition, Cambridge University Press, 1989, which is hereby incorporated by reference herein.

At its most basic, the load simulation circuitry 125 is capable of measuring the load current on a brake control signal 1015 emanating from the tow-vehicle brake controller 1005, and then activating and deactivating one or more of five resistors 130, 135, 140, 145, 150 to modify the load current to achieve a desired load current set by a user. Initially, current across a shunt resistor 155 is measured by a current monitor 160. Current data 165 representative of this measured current is then sent to a microcontroller 170, which compares the measured current against the desired load current, and then sends commands (driver control signals 175) to a low side driver 180, which individually controls a set of five relays 185, 190, 195, 200, 205 via relay control signals 210. Each relay 185, 190, 195, 200, 205 is able to activate and deactivate a respective one of the five resistors 130, 135, 140, 145, 150 that are arranged in parallel with respect to the incoming brake control signal 1015. By variously switching the several relays 185, 190, 195, 200, 205 on and off, the microcontroller 170 is able to apply different combinations of the parallel resistors 130, 135, 140, 145, 150 to the brake control signal 1015 so as to modify the load resistance and, ultimately, the load current, to achieve the desired load current. This measure-and-activate/deactivate process is repeated so that the microcontroller 170 continues to receive the measured current and adjust the load resistance in almost real time.

If, for example, the brake control signal 1015 is 12 V in a PWM form, and the five resistors 130, 135, 140, 145, 150 comprise 12Ω, 6Ω, 3Ω, 1.5Ω, and 0.75Ω resistors, respectively, the load simulation circuitry 125 would be capable of simulating load currents between about 1 A and 31 A. One amp would be achieved with only the first resistor 130 made active (12Ω), while 31 A would be achieved with all five parallel resistors 130, 135, 140, 145, 150 made active. This would allow simulation of a trailer with between one and four axles (e.g., 7 A, 14 A, 21 A, and 28 A, assuming a load current of 7 A per axle). Of course, additional relays/resistors and/or different resistor values may be implemented to both change the range and precision of the constant current load achievable by the load simulation circuitry 125. These alternative embodiments would also come within the scope of the invention.

As indicated above, the current monitor 160 measures the voltage drop across the shunt resistor 155 and converts that voltage drop to a measured current, which is provided to the microcontroller 170 as the current data 165. In one or more embodiments, the current monitor 160 may comprise, for example, an INA226 available from TEXAS INSTRUMENTS® (Dallas, Tex., USA). The microcontroller 170, in turn, sends the driver control signals 175 to the low side driver 180, which individually controls the relays 185, 190, 195, 200, 205 via the relay control signals 210. In one or more embodiments, the microcontroller 170 may comprise a PIC24FJ64GA002-I/SS available from MICROCHIP TECHNOLOGY (Chandler, Ariz., USA), and the low side driver 180 may comprise a TPL747LA available from TEXAS INSTRUMENTS®. Such a low side driver is capable of outputting up to about 30 V per output channel in response to logic level inputs (i.e, 1.8-5 V inputs).

Once the functions of the microcontroller 170 are understood from the teachings herein, those functions may be programmed by one having ordinary skill in the programming arts. The programming of a microcontroller is, moreover, described in many readily available references, including, as just one example, J. R. Smith, Programming the PIC Microcontroller with MBASIC, Newnes, 2005, which is hereby incorporated by reference herein.

The relays 185, 190, 195, 200, 205 may, in one or more non-limiting embodiments, comprise T99S1D12-5 relays available from POTTER & BRUMFIELD® via MOUSER® ELECTRONICS (Mansfield, Tex., USA), which may be actuated by 5-V relay control signals 210 from the low side driver 180. The resistors 130, 135, 140, 145, 150 may comprise HSC200-, HSC100-, and HSA50-series power wire-wound resistors available from TE CONNECTIVITY® LTD (Schaffhausen, Switzerland). It may be advantageous to have the resistors 130, 135, 140, 145, 150 arranged in a binary progression with the initial resistor 130 set at a value of xΩ, and the remaining resistors 135, 140, 145, 150 set at respective ohmic values of x/2, x/4, x/8, and x/16. Such a progression tends to provide a relatively fine control of the load current.

Heat is a concern when implementing a load simulator such as that described above. At 12 V and 31 A, power may be about 372 watts (W), which must be effectively dissipated without damaging elements of the device. Two solutions are provided in the illustrative load simulator 100. First, the resistors 130, 135, 140, 145, 150 in the illustrative embodiment are tied to a heat sink 215 (FIG. 3), which may comprise a thermally conductive material such as aluminum with high-surface-area fins that are exposed to ambient air. One or more electric fans may be utilized to better circulate air over the heat sink 215, if so desired. The second solution comprises a temperature sensor 220 that sends temperature data 225 concerning the internal temperature of the load simulator 100 to the microcontroller 170. The temperature sensor 220 may comprise, as just one example, a TMP100 available from TEXAS INSTRUMENTS®. In response to the temperature data 225, the microcontroller 170 may be programmed to sound an audible alarm, visually indicate a fault, and/or take the resistors 130, 135, 140, 145, 150 offline if an excessive temperature is detected. The microcontroller 170 may also cycle one or more of the resistors 130, 135, 140, 145, 150 on and off, effectively reducing their duty cycle, in response to a sensed temperature excursion.

The user interface 127 of the load simulator 100 may comprise several controls, which when manipulated by the user, act to set software values in the microcontroller 170. The user may be availed of a control (e.g., knob), for example, that allows the user to set the number of axles that should be simulated by the load simulation circuitry 125. Alternatively, or additionally, a control (e.g., knob) may allow the user to directly set the desired load current (e.g., 1-31 A). A first LED display may indicate the load current actually sensed by the current monitor 160 and transmitted to the microcontroller 170. A second LED display may indicate the voltage of the brake control signal 1015. Fault lights may indicate faults such as over-temperature conditions measured by the temperature sensor 220.

As indicated in the Background, sophisticated brake controllers may look for not only load current, but also may look for other signatures of a properly connected trailer with electric brakes. Electric trailer brakes use an electromagnet to supply the braking energy to the trailer. Electrically, these brake magnets may have the same electrical signature as a typical inductor. When a DC voltage is placed across an inductor, the current rises from zero amps to its final value over a period of time (i.e., not instantaneously). Accordingly, if the load simulator 100 were to only provide a constant current without this ramping effect, then a tow vehicle may indicate an error or fault.

U.S. Pat. No. 10,196,052 to I. R. Vinci et al., and entitled "Brake Controller Tester" (hereinafter, "the '052 Patent"), which is hereby incorporated by reference herein, describes circuitry that simulates such an inductive signature. The referenced tester sequentially applies several parallel resistors to a brake control signal in response to commands received from a microcontroller. Notably, similar circuitry may be applied to aspects of the present invention to provide a similar effect, namely, to cause a load current to ramp up over time in the manner of inductive devices. While the tester in the '052 Patent utilizes a single set of parallel resistors (R1, R2, R3 in FIG. 3 of the '052 Patent), several such sets of parallel resistors may be incorporated into a load simulator in accordance with the present invention so as to simulate a trailer with several axles and several corresponding sets of electric trailer brakes. A single user interface may display both indications associated with the present invention as well as the indications of braking intensity discussed in the '052 Patent.

Apparatus in accordance with aspects of the invention provide several advantages over constant current loads that utilize only active components. Resistors are often less sensitive to heat and other stresses than semiconductor devices such as operational amplifiers and metal-oxide-semiconductor field effect transistors (MOSFETs). Dissipation of heat is also more problematic with semiconductor devices. If power remains somewhat moderate, it is likely, for example, that aspects of the invention could be implemented solely with mechanical heat sinks and without need for electric fans or other such components.

It should again be emphasized that the above-described embodiments of the invention are intended to be illustrative only. Other embodiments can use different types and arrangements of elements for implementing the described functionality. For example, while the illustrative load simulation circuitry 100 utilizes a microcontroller 170, other embodiments may instead utilize discrete components to perform the requisite functions. Even other embodiments may replace one or more of the relays 185, 190, 195, 200, 205 with other types of switches, such as transistors. These numerous alternative embodiments within the scope of the appended claims will be apparent to one skilled in the art.

At the same time, while the above described load simulator 100 was directed at simulating a trailer for a tow-vehicle brake controller 1005, aspects of the invention may be more generally applied to constant current loads of any type. It is therefore contemplated that aspects of the invention may be viable means of creating user-selectable constant current loads for any number of applications.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

What is claimed is:

1. An apparatus comprising:
   current monitoring circuitry operative to measure a current of an input signal;
   a plurality of resistors arranged in parallel on the input signal;
   a plurality of switches, each of the plurality of switches operative to activate and deactivate a respective one of the plurality of resistors;
   microcontroller circuitry operative to control the plurality of switches at least in part based on data from the current monitoring circuitry; and
   temperature sensor circuitry operative to measure a temperature in the apparatus;
   wherein the microcontroller circuitry is further operative to control the plurality of switches at least in part based on data from the temperature sensor circuitry.

2. An apparatus comprising:
   current monitoring circuitry operative to measure a current of an input signal;
   a plurality of resistors arranged in parallel on the input signal;
   a plurality of switches, each of the plurality of switches operative to activate and deactivate a respective one of the plurality of resistors;
   microcontroller circuitry operative to control the plurality of switches at least in part based on data from the current monitoring circuitry; and
   a user interface adapted to allow a user to input a desired number of trailer axles to be simulated.

3. A method of simulating a load current, the method comprising the steps of:
   measuring a current of an input signal;
   controlling a plurality of switches via microcontroller circuitry at least in part based on the measured current, each of the plurality of switches operative to activate and deactivate a respective resistor of a plurality of resistors arranged in parallel on the input signal;
   measuring a temperature; and
   controlling the plurality of switches at least in part based on the measured temperature.

4. A method of simulating a load current, the method comprising the steps of:
   measuring a current of an input signal;
   controlling a plurality of switches via microcontroller circuitry at least in part based on the measured current, each of the plurality of switches operative to activate and deactivate a respective resistor of a plurality of resistors arranged in parallel on the input signal; and
   allowing a user to input a desired number of trailer axles to be simulated.

\* \* \* \* \*